US008845343B2

(12) United States Patent
Lee et al.

(10) Patent No.: US 8,845,343 B2
(45) Date of Patent: Sep. 30, 2014

(54) ARRAY SUBSTRATE FOR REFLECTIVE TYPE OR TRANSFLECTIVE TYPE LIQUID CRYSTAL DISPLAY DEVICE

(71) Applicant: LG Display Co., Ltd., Seoul (KR)

(72) Inventors: Jae-Kyun Lee, Goyang-si (KR); Jae-Young Oh, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/261,980

(22) Filed: Apr. 25, 2014

(65) Prior Publication Data
US 2014/0231806 A1 Aug. 21, 2014

Related U.S. Application Data

(62) Division of application No. 13/100,771, filed on May 4, 2011, now Pat. No. 8,735,187.

(30) Foreign Application Priority Data

May 5, 2010 (KR) .................. 10-2010-0042207

(51) Int. Cl.
*G02F 1/1335* (2006.01)
*H01L 27/12* (2006.01)
(52) U.S. Cl.
CPC ................. *H01L 27/1255* (2013.01)
USPC ............. 439/113; 439/114; 439/193
(58) Field of Classification Search
CPC ............ G02F 1/133504; G02F 1/133553; G02B 6/0056; G02B 6/0018; G02B 5/0221; G02B 5/0284; H01L 33/22

USPC .............. 349/5, 106, 113–114, 187, 193–202
See application file for complete search history.

(56) References Cited

U.S. PATENT DOCUMENTS

| 4,834,501 | A | 5/1989 | Honda et al. |
| 6,208,395 | B1 | 3/2001 | Kanoh et al. |
| 2004/0072444 | A1 | 4/2004 | Park et al. |
| 2004/0125325 | A1 | 7/2004 | Marai et al. |
| 2007/0153175 | A1 | 7/2007 | Chang et al. |
| 2009/0161050 | A1* | 6/2009 | Kim .............................. 349/114 |

FOREIGN PATENT DOCUMENTS

CN 1637530 A 7/2005

* cited by examiner

*Primary Examiner* — H Tsai
(74) *Attorney, Agent, or Firm* — McKenna Long & Aldrdige LLP

(57) ABSTRACT

An array substrate for a liquid crystal display device includes a substrate, a gate line and a data line on the substrate and crossing each other to define a pixel region, a thin film transistor connected to the gate line and the data line, a first passivation layer on the thin film transistor and having a first unevenness structure at its top surface, an auxiliary unevenness layer on the first passivation layer and having a first roughness structure at its top surface, and a reflector on the auxiliary unevenness layer, the reflector having a second unevenness structure due to the first unevenness structure of the first passivation layer and a second roughness structure due to the first roughness structure of the auxiliary unevenness layer, the second roughness structure having smaller patterns than the second unevenness structure.

9 Claims, 11 Drawing Sheets

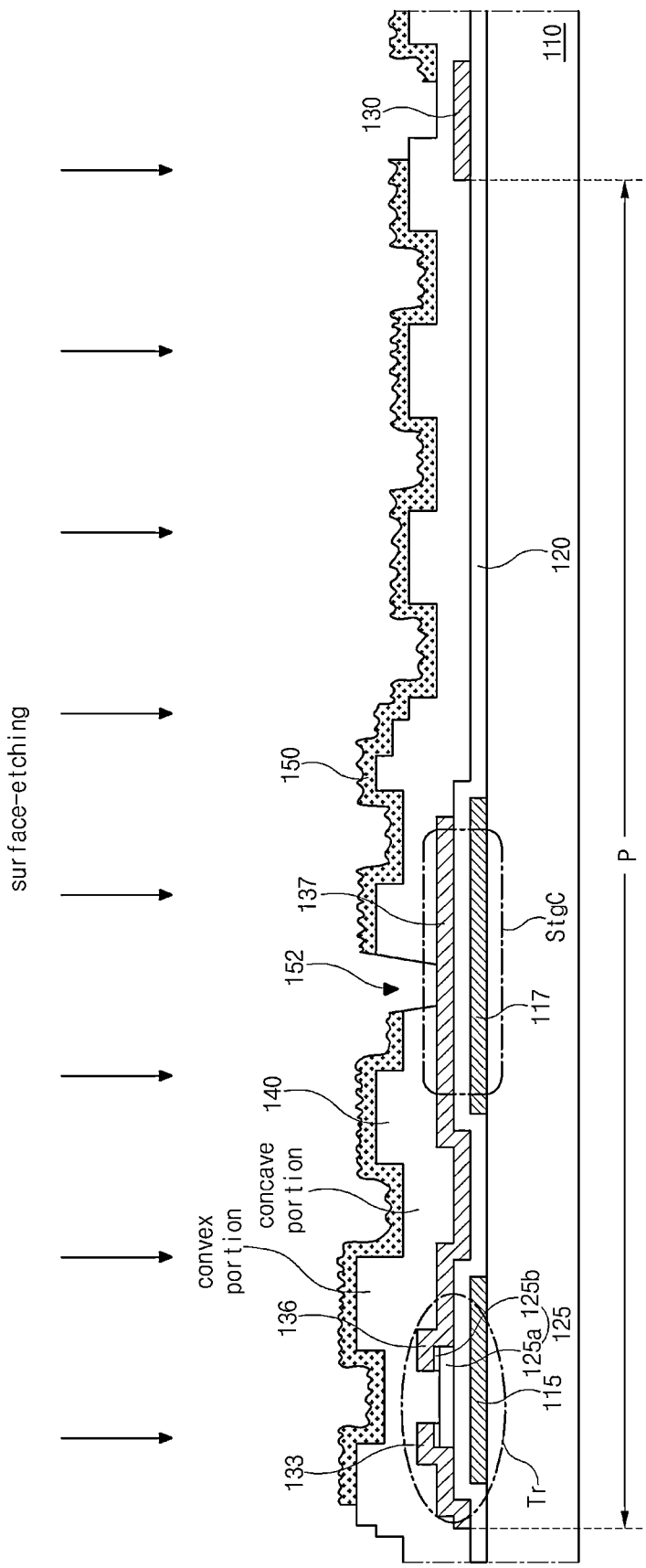

ARRAY SUBSTRATE FOR REFLECTIVE TYPE OR TRANSFLECTIVE TYPE LIQUID CRYSTAL DISPLAY DEVICE

This application is a divisional application of U.S. patent application Ser. No. 13/100,771 filed May 4, 2011, which claims the benefit of Korean Patent Application No. 10-2010-0042207 filed in Korea on May 5, 2010, each of which are hereby incorporated by reference for all purposes as if fully set forth herein.

BACKGROUND

1. Field of the Disclosure

The disclosure relates to a liquid crystal display device, and more particularly, to an array substrate for a reflective type or transflective type liquid crystal display device improving reflection efficiency and a method of fabricating the same.

2. Discussion of the Related Art

With rapid development of information technologies, electronic display devices for displaying the information have been actively proposed and developed. More particularly, flat panel display (FPD) devices having a thin profile, light weight and low power consumption have been actively pursued. FPD devices can be classified into an emissive type and a non-emissive type depending on their light emission capability. In an emissive type FPD device, an image is displayed using light that emanates from the FPD device. In a non-emissive type FPD device, an image is displayed using light from an external source that reflects and/or transmits through the FPD. For example, a plasma display panel (PDP) device and a field emission display (FED) device are an emissive type. In another example, an electroluminescent display (ELD) device is an emissive type FPD device. Unlike a PDP and an ELD, a liquid crystal display (LCD) device is a non-emissive type FPD device that uses a backlight as a light source.

Among the various types of FPD devices, liquid crystal display (LCD) devices have been widely used as monitors for notebook computers and desktop computers because of their high resolution, good color rendering capability and superiority in displaying moving images. The LCD device displays images by controlling a transmittance of light through the device. More particularly, liquid crystal molecules interposed between two substrates facing each other modulate light transmission in response to an electric field generated between electrodes on the substrates.

Because the LCD device does not emit light, the LCD device needs a separate light source. Thus, a backlight is disposed on the rear surface on a liquid crystal panel of the LCD device, and images are displayed with the light emitted from the backlight and transmitted through the liquid crystal panel. Accordingly, the above-mentioned LCD device is referred to as a transmissive type LCD device. The transmissive type LCD device can display bright images in a dark environment due to the use of a separate light source, such as a backlight, but may result in large power consumption because of the use of the backlight.

To solve the problem of the large power consumption, a reflective type LCD device has been developed. The reflective type LCD device controls transmittance of light by reflecting the outside natural light or artificial light through a liquid crystal layer. In a reflective type LCD device, a pixel electrode on a lower substrate is formed of a conductive material having a relatively high reflectance and a common electrode on an upper substrate is formed of a transparent conductive material.

FIG. 1 is a cross-sectional view of illustrating an array substrate for a reflective type LCD device according to the related art. FIG. 1 shows a pixel region including a thin film transistor.

In FIG. 1, a thin film transistor Tr including a gate electrode 15, a gate insulating layer 20, a semiconductor layer 25, and source and drain electrodes 33 and 36 is formed on a substrate 10, on which a gate line (not shown) and a data line 30 cross each other to define a pixel region P.

A first passivation layer 39 of an inorganic insulating material is formed on the thin film transistor Tr. A second passivation layer 45 of an organic insulating material is formed on the first passivation layer 39. The second passivation layer 45 has an embossed surface. A third passivation layer 49 of an inorganic insulating material is formed on the second passivation layer 45. The first, second and third passivation layers 39, 45 and 49 have a drain contact hole 47 exposing the drain electrode 36.

A reflector 52 is formed on the third passivation layer 49 in the pixel region P. The reflector 52 is formed of a metallic material having relatively high reflectance. The reflector 52 contacts the drain electrode 36 through the drain contact hole 47 and functions as a reflective electrode. The reflector 52 and the third passivation layer 49 have embossed surfaces due to the embossed surface of the second passivation layer 45.

The reflective type LCD device including the reflector 52 of the embossed surface has higher reflection efficiency and visibility than a reflective type LCD including a flat surface of a reflector.

However, the reflectance in the reflective type LCD device including the reflector 52 of the embossed surface is about 65%. A reflective type LCD device having more improved reflection efficiency and visibility has been needed for personal mobile devices.

SUMMARY OF THE DISCLOSURE

Accordingly, the present disclosure is directed to a reflective type liquid crystal display device that substantially obviates one or more of the problems due to limitations and disadvantages of the related art.

An object of the present disclosure is to provide a reflective type liquid crystal display device that improves the reflection efficiency of the reflector.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of embodiments of the disclosure, as embodied and broadly described, an array substrate for a liquid crystal display device includes a substrate, a gate line and a data line on the substrate and crossing each other to define a pixel region, a thin film transistor connected to the gate line and the data line, a first passivation layer on the thin film transistor and having a first unevenness structure at its top surface, an auxiliary unevenness layer on the first passivation layer and having a first roughness structure at its top surface, and a reflector on the auxiliary unevenness layer, the reflector having a second unevenness structure due to the first unevenness structure of the first passivation layer and a second roughness structure due to the first roughness structure of the auxiliary unevenness layer, the second roughness structure having smaller patterns than the second unevenness structure.

In another aspect, a fabricating method of an array substrate for a liquid crystal display device includes forming a gate line and a data line on a substrate, the gate line and the data line crossing each other to define a pixel region, forming a thin film transistor connected to the gate line and the data line, forming a first passivation layer on the thin film transistor and having a first unevenness structure at its top surface, forming an auxiliary unevenness layer on the first passivation layer and having a first roughness structure at its top surface, and forming a reflector on the auxiliary unevenness layer, the reflector having a second unevenness structure due to the first unevenness structure of the first passivation layer and a second roughness structure due to the first roughness structure of the auxiliary unevenness layer, the second roughness structure having smaller patterns than the second unevenness structure.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 7A to 7F are cross-sectional views of an array substrate for the LCD device in steps of a method of fabricating the same according to the first exemplary embodiment of the disclosure.

DETAILED DESCRIPTION OF EXEMPLARY EMBODIMENTS

Reference will now be made in detail to exemplary embodiments of the disclosure, which are illustrated in the accompanying drawings.

Figure 2:
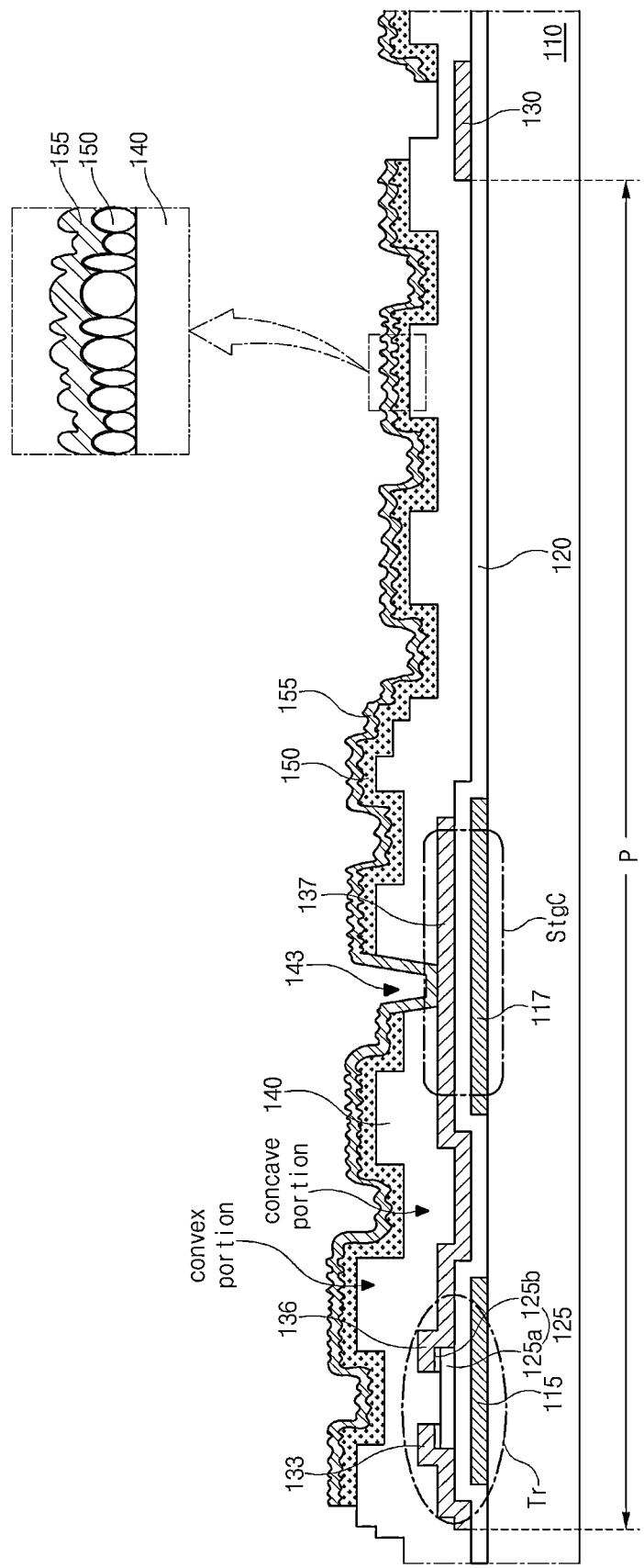
FIG. 2 is a cross-sectional view of illustrating an array substrate for a reflective type LCD device according to a first exemplary embodiment of the disclosure.

FIG. 2 is a cross-sectional view of illustrating an array substrate for a reflective type LCD device according to a first exemplary embodiment of the disclosure. FIG. 2 shows a pixel region including a thin film transistor as a switching element.

In FIG. 2, the array substrate of the reflective type LCD device of the disclosure may include a gate line (not shown) and a data line 130 on a substrate 110. The gate line and the data line 130 cross each other to define a pixel region P. A gate insulating layer 120 may be interposed between the gate line and the data line 130.

A common line 117 may be formed at the same layer as the gate line. The common line 117 may be parallel to and spaced apart from the gate line. The common line 117 may pass through the pixel region P. A portion of the common line 117 in the pixel region P may function as a first storage electrode.

A thin film transistor Tr may be formed at a crossing portion of the gate line and the data line 130 in the pixel region P as a switching element. The thin film transistor Tr may include a gate electrode 115, the gate insulating layer 120, a semiconductor layer 125, and source and drain electrodes 133 and 136. The semiconductor layer 125 may include an active layer 125a and ohmic contact layers 125b. The source and drain electrodes 133 and 136 may be spaced apart from each other.

The drain electrode 136 may extend to an area where the first storage electrode 117 is disposed and overlaps the first storage electrode 117 with the gate insulating layer 120 therebetween. A portion of the drain electrode 136 overlapping the first storage electrode 117 may function as a second storage electrode 137. The first and second storage electrodes 117 and 137 may form a storage capacitor StgC.

A passivation layer 140 may be formed on the thin film transistor Tr, the data line 130 and the storage capacitor StgC. The passivation layer 140 may be formed of an inorganic insulating material such as silicon nitride ($SiNx$) or silicon oxide ($SiO_2$) and may have an unevenness structure at its surface. The passivation layer 140 may have an average thickness of 1 μm to 2 μm, and the difference in heights of concave and convex portions may be 0.5 μm to 1 μm.

An auxiliary unevenness layer 150 may be formed on the passivation layer 140 having the unevenness structure at its surface. The auxiliary unevenness layer 150 may be formed of a material including germanium, for example, germanium (Ge), germanium silicon (GeSi) or germanium carbide (GeC). The auxiliary unevenness layer 150 may have an unevenness structure due to the passivation layer 140. In addition, a surface of the auxiliary unevenness layer 150 may be selectively etched, and the auxiliary unevenness layer 150 may have a roughness structure including minute concave and convex portions smaller than the unevenness structure of the auxiliary unevenness layer 150.

Since the unevenness structure of the passivation layer 140 may be patterned through a mask process, the concave and convex portions of the passivation layer 140 may have widths of 2 μm to 10 μm. Since the minute concave and convex portions of the auxiliary unevenness layer 150 may be formed by an etchant using particle properties of germanium, the minute concave and convex portions of the auxiliary unevenness layer 150 may have widths of 0.01 μm to 0.5 μm.

Concave and convex portions of the unevenness structure of the auxiliary unevenness layer 150 may have a difference in heights of 0.5 μm to 1 μm, and the unevenness structure of the auxiliary unevenness layer 150 may have a rough surface.

Figure 3:
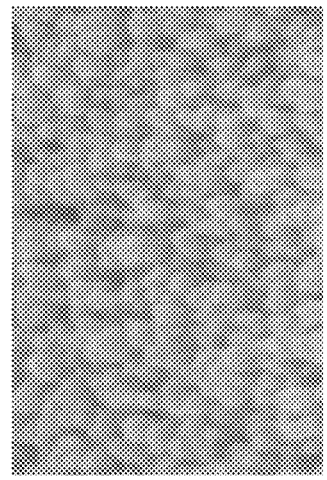
FIG. 3 is a scanning electron microscope (SEM) picture showing and example of the surface of the auxiliary unevenness layer in the reflective type LCD device according to the first exemplary embodiment of the disclosure.

FIG. 3 is a scanning electron microscope (SEM) picture showing an example of the surface of the auxiliary unevenness layer in the reflective type LCD device according to the first exemplary embodiment of the disclosure.

In FIG. 3, the minute concave and convex portions may be formed at the surface of the auxiliary unevenness layer, and the surface of the auxiliary unevenness layer may be very rough. A method of forming the auxiliary unevenness layer having the above-mentioned surface will be explained in detail later.

A reflector 155 may be formed on the auxiliary unevenness layer 150 in the pixel region P. The reflector 155 may be formed of a metallic material having relatively high reflectance, for example, one of aluminum (Al), aluminum neodymium (AlNd), silver (Ag), magnesium oxide (MgO) and titanium oxide (TiOx). The reflector 155 may be connected to the drain electrode 136 through a drain contact hole 143, which may be formed by patterning the passivation layer 140 and the auxiliary unevenness layer 150 to expose the drain electrode 136, and the reflector 155 functions as a pixel electrode.

Here, the reflector 155 may have unevenness with widths of 2 μm to 10 μm and a difference in heights of concave and convex portions of 0.5 μm to 1 μm and has minute roughness with widths of 0.01 μm to 0.5 μm at a surface of the unevenness structure of the reflector 155 due to the auxiliary unevenness layer 150.

Figure 1:
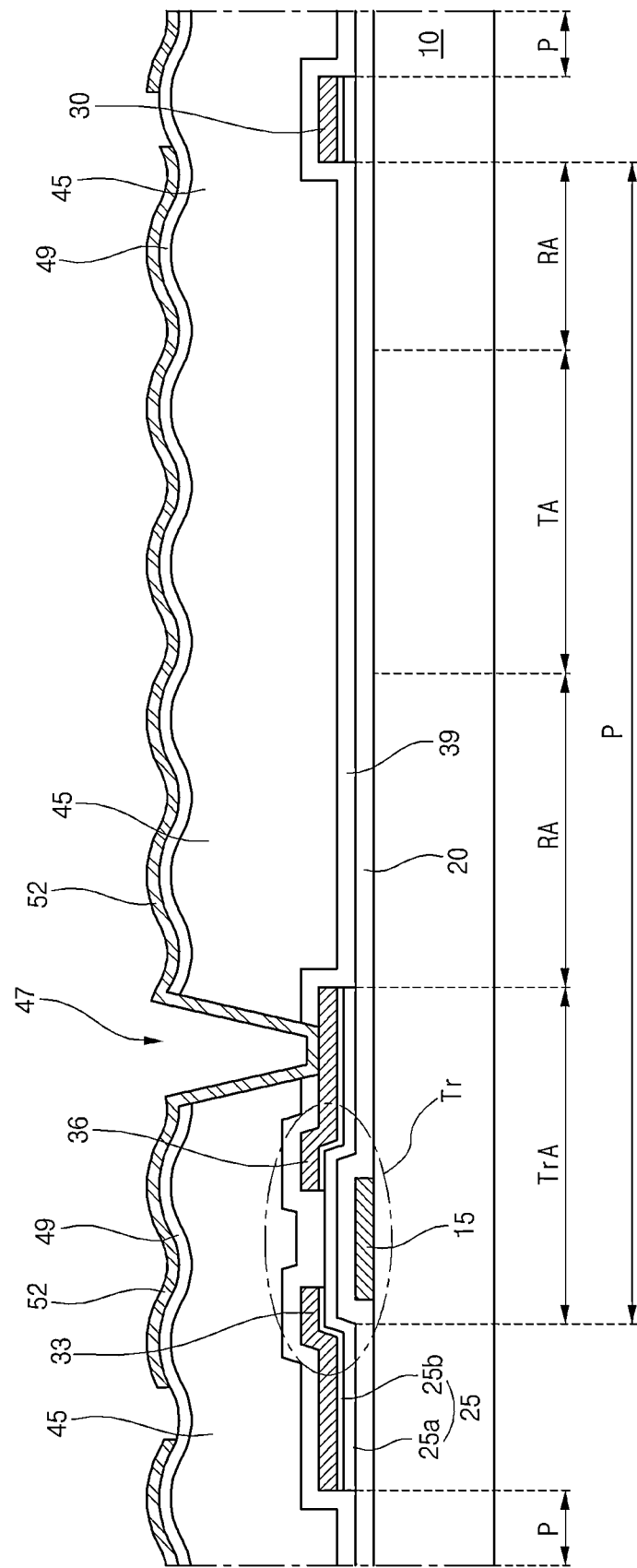
FIG. 1 is a cross-sectional view of illustrating an array substrate for a reflective type LCD device according to the related art.

In the reflective type LCD device according to the first exemplary embodiment of the disclosure, the reflector 155 may have the relatively large unevenness of more than 2 μm, and the minute roughness of 0.01 μm to 0.5 μm may be irregularly formed at the surface of the reflector 155 having the unevenness. Thus, scattering properties of light coming from the outside can be increased, and the reflection efficiency can be improved as compared to the reflective type LCD device of the related art having the reflector 52 of FIG. 1.

In the first embodiment of the disclosure, the passivation layer 140 of an inorganic insulating material may be formed to have the unevenness structure at its surface, and the auxiliary unevenness layer 150 of a material including germanium may be formed on the passivation layer 140 to have the unevenness structure and the roughness structure including the minute concave and convex portions. Then, the reflector 155 may be formed on the auxiliary unevenness layer 150. The reflective type LCD device according to the first embodiment of the disclosure may have reflectance of about 75%, while the reflective type LCD device of the related art has reflectance of about 65%. Therefore, the reflective type LCD device according to the first embodiment of the disclosure has improved reflection efficiency. In addition, to form the unevenness and the roughness of the reflector 155, the reflective type LCD device according to the first embodiment of the disclosure may have the passivation layer 140 and the auxiliary unevenness layer 150, while the reflective type LCD device of the related art has the first, second and third passivation layers 39, 45 and 49. Accordingly, the manufacturing processes are simplified as compared to the related art.

Figure 4:
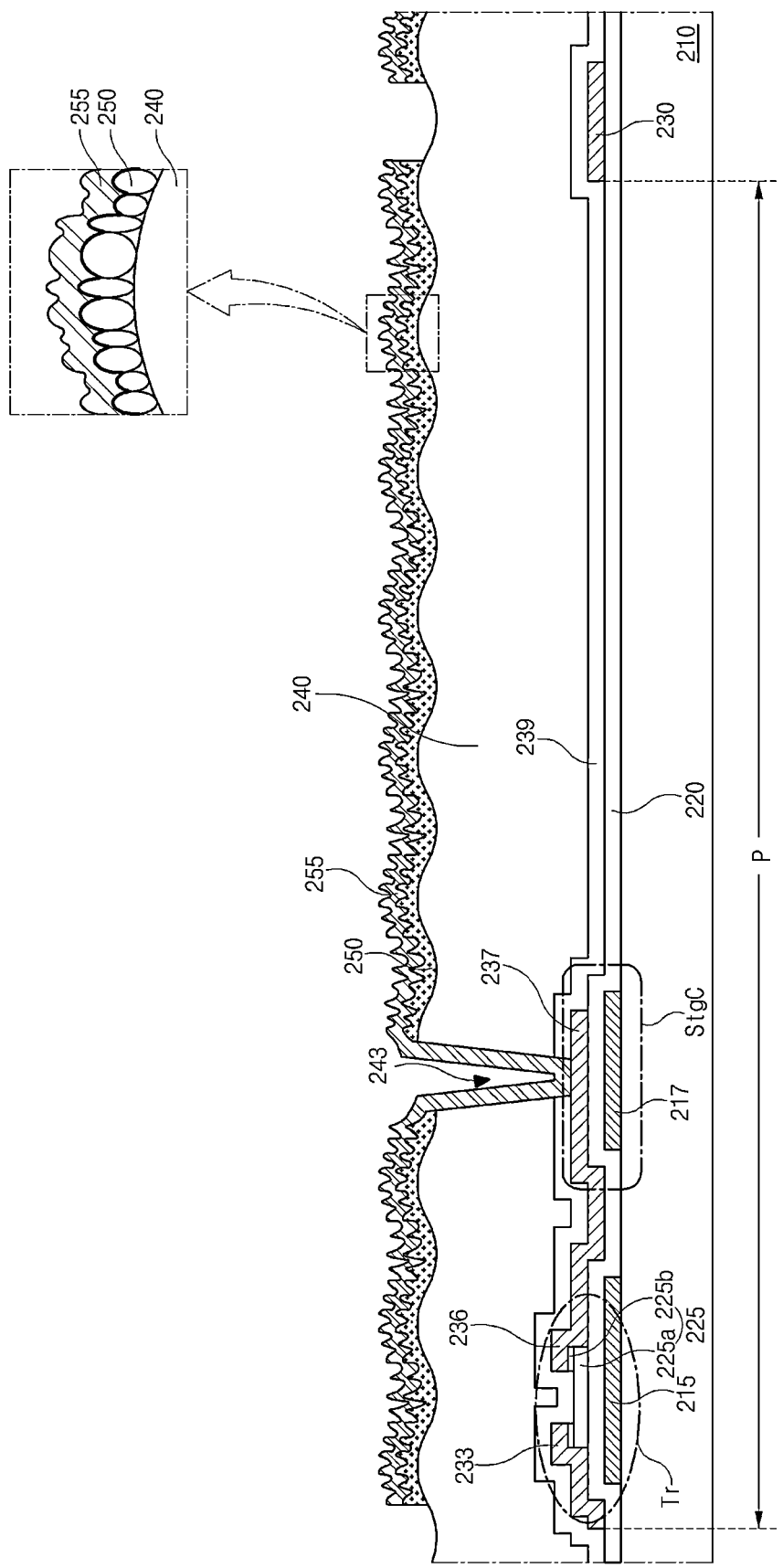
FIG. 4 is a cross-sectional view of illustrating an array substrate for a reflective type LCD device according to a second exemplary embodiment of the disclosure.

FIG. 4 is a cross-sectional view of illustrating an array substrate for a reflective type LCD device according to a second exemplary embodiment of the disclosure. FIG. 4 shows a pixel region including a thin film transistor as a switching element. The reflective type LCD device of the second embodiment of the disclosure may have the similar structure to that of the first embodiment except for passivation layers. For convenience of explanation, the same parts as the first embodiment may have similar references, and the explanations for the same parts will be omitted.

In FIG. 4, a thin film transistor Tr, which may include a gate electrode 215, a semiconductor layer 225, and source and drain electrodes 233 and 236, and a storage capacitor StgC, which includes first and second storage electrodes 217 and 237 with a gate insulating layer 220 therebetween, may be formed on a substrate 210. The semiconductor layer 225 may include an active layer 225a and ohmic contact layers 225b. A gate line (not shown) may be formed on the substrate 210, and a data line 230 may be formed on the gate insulating layer 220.

A first passivation layer 239 may be formed on the thin film transistor Tr, the data line 230 and the storage capacitor StgC. The first passivation layer 239 may be formed of an inorganic insulating material such as silicon nitride (SiNx) or silicon oxide (SiO$_2$).

A second passivation layer 240 may be formed on the first passivation layer 239. The second passivation layer 240 may be formed of an organic insulating material such as photo acryl or benzocyclobutene (BCB). The second passivation layer 240 may have an unevenness structure of a curved profile. More particularly, the second passivation layer 240 may have an embossed structure including embossed patterns of 2 μm to 10 μm at its surface.

In the first embodiment, the passivation layer 140 of FIG. 2 of an inorganic insulating material may be patterned by performing a dry etching process, and the unevenness structure of the passivation layer 140 of FIG. 2 may have a cross-section of an angled profile. On the other hand, the second passivation layer 240 of the second embodiment may be formed by performing a heat-treatment process, and the embossed structure of the second passivation layer 240 may have a cross-section of a curved profile including semicircles or semi-ellipses.

An auxiliary unevenness layer 250 may be formed on the second passivation layer 240 having the embossed structure. The auxiliary unevenness layer 250 may be formed of a material including germanium, for example, germanium (Ge), germanium silicon (GeSi) or germanium carbide (GeC). The auxiliary unevenness layer 250 may have a roughness structure including minute concave and convex portions at its surface.

A reflector 255 may be formed on the auxiliary unevenness layer 250 and may be connected to the drain electrode 236 through a drain contact hole 243, which may be formed through the first and second passivation layers 239 and 240 and the auxiliary unevenness layer 250. The reflector 255 may have an embossed structure due to the second passivation layer 240 and a roughness structure due to the auxiliary unevenness layer 250. Therefore, the reflection efficiency is improved similarly to the first embodiment.

Figure 5:
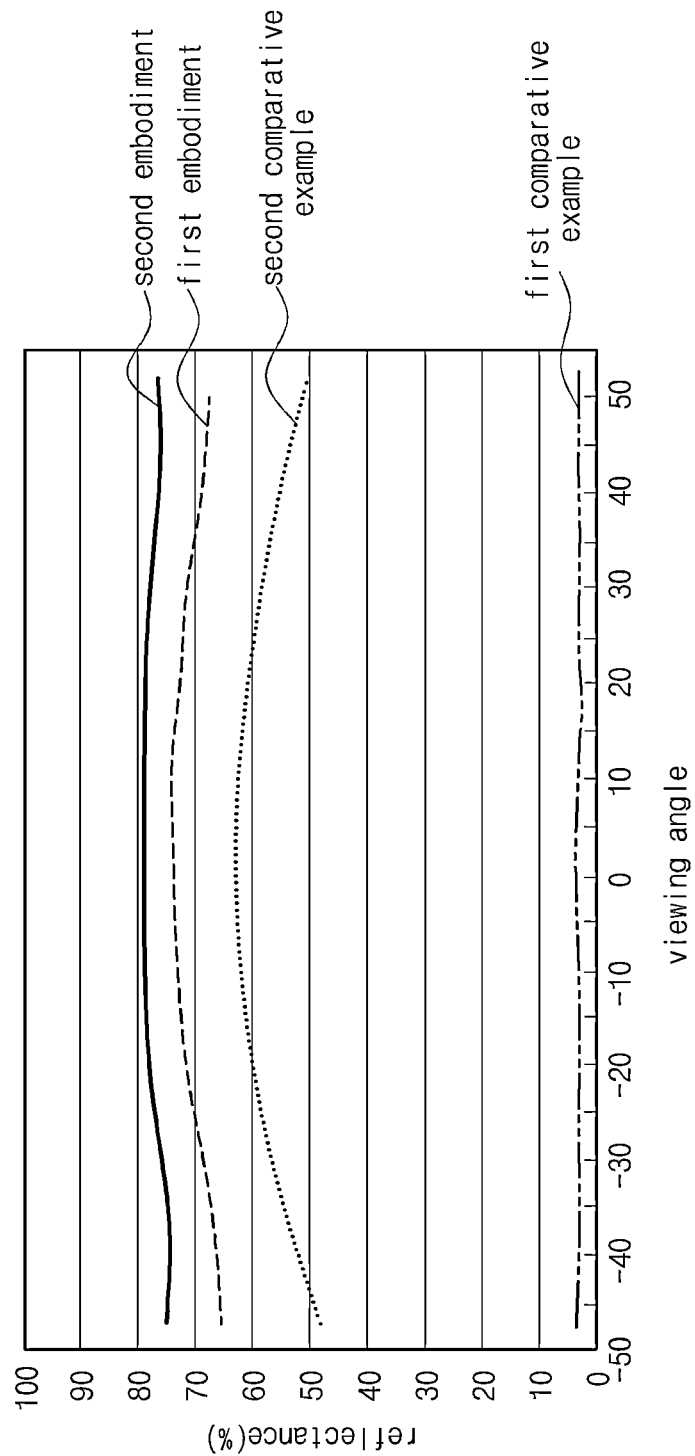
FIG. 5 is a graph illustrating reflectance depending on viewing angles in an reflective type LCD device according to the first and second exemplary embodiments of the disclosure.

FIG. 5 is a graph illustrating reflectance depending on viewing angles in a reflective type LCD device according to the first and second exemplary embodiments of the disclosure. FIG. 5 also shows reflectance depending on viewing angles in reflective type LCD devices having reflectors of a flat surface and an embossed structure, respectively, as first and second comparative examples.

In FIG. 5, the reflective type LCD device of the first embodiment may have reflectance of about 73% at the viewing angle of 0 degree, that is, when the device is seen at the front. The reflective type LCD device of the second embodiment may have reflectance of about 79% at the viewing angle of 0 degree.

On the other hand, the reflective type LCD device having the reflector of the flat surface as the first comparative example has the reflectance of about 3% at the viewing angle of 0 degree, and the reflective type LCD device having the reflector of the embossed surface as the second comparative example has the reflectance of about 63% at the viewing angle of 0 degree, that is, at the front.

Therefore, it is noted that the reflective type LCD devices of the first and second embodiments have the reflection efficiency improved by 10% to 16% as compared with the reflective type LCD device of the related art.

Figure 6:
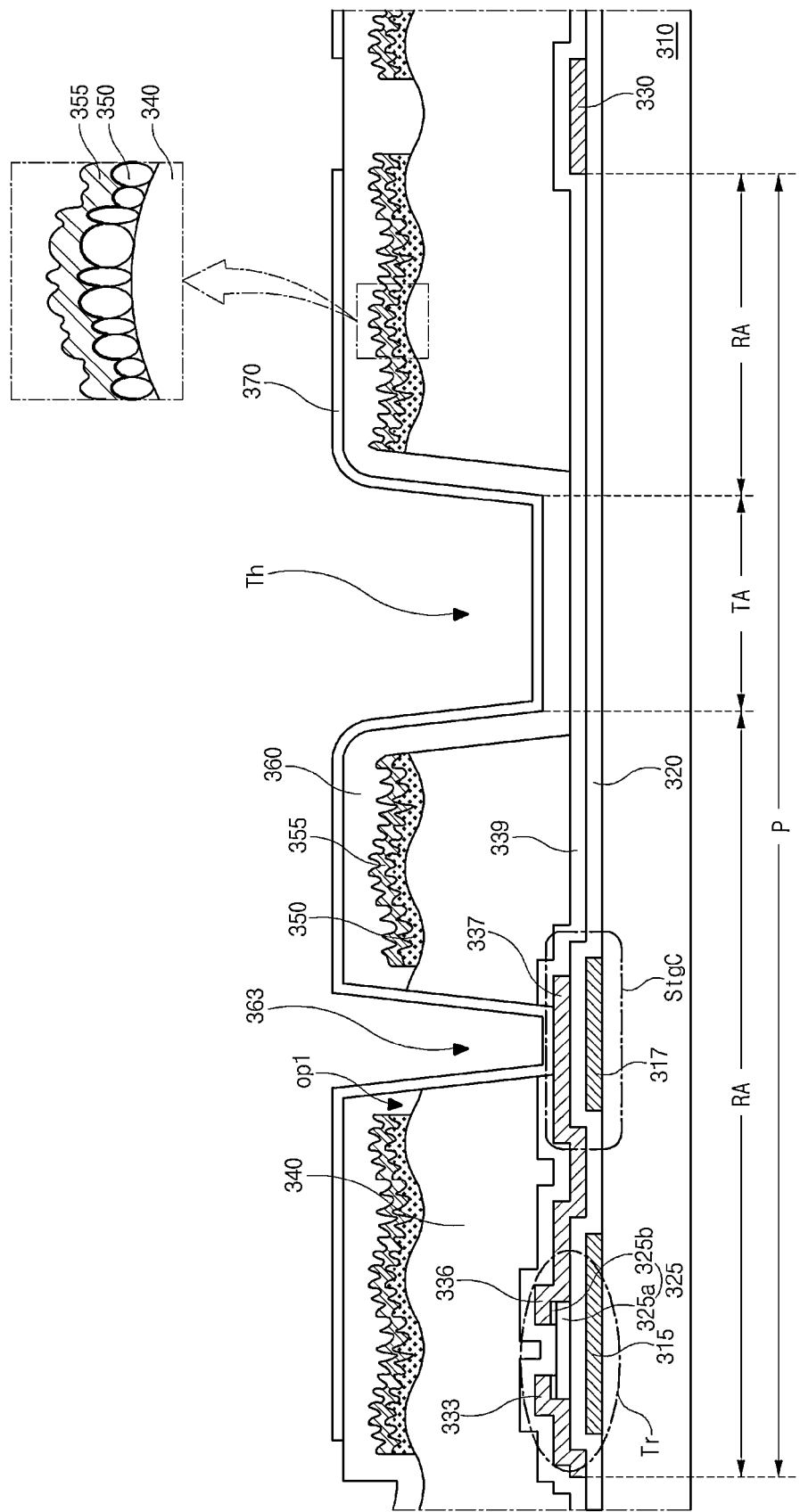
FIG. 6 is a cross-sectional view of illustrating an array substrate for a transflective type LCD device according to a third exemplary embodiment of the disclosure.

FIG. 6 is a cross-sectional view of illustrating an array substrate for a transflective type LCD device according to a third exemplary embodiment of the disclosure. FIG. 6 shows a pixel region including a thin film transistor as a switching element. In the transflective type LCD device of the third embodiment of the disclosure, the pixel region may include a reflective area with a reflector and a transmissive area without a reflector. For convenience of explanation, the same parts as the first and second embodiments may have the similar references, and the explanations for the same parts will be omitted.

In FIG. 6, a thin film transistor Tr, which may include a gate electrode 315, a semiconductor layer 325, and source and drain electrodes 333 and 336, and a storage capacitor StgC, which includes first and second storage electrodes 317 and 337 with a gate insulating layer 320 therebetween, may be formed on a substrate 310. The semiconductor layer 325 may include an active layer 325a and ohmic contact layers 325b. A gate line (not shown) may be formed on the substrate 310, and a data line 330 is formed on the gate insulating layer 320. The thin film transistor Tr and the storage capacitor StgC correspond to a reflective area RA.

A first passivation layer 339 may be formed on the thin film transistor Tr, the data line 330 and the storage capacitor StgC. The first passivation layer 339 may be formed of an inorganic insulating material such as silicon nitride (SiNx) or silicon oxide ($SiO_2$).

A second passivation layer 340 may be formed on the first passivation layer 339. The second passivation layer 340 may be formed of an organic insulating material such as photo acryl or benzocyclobutene (BCB). The second passivation layer 340 may have an unevenness structure including a cross-section of a curved profile, that is, an embossed structure including embossed patterns. Alternatively, the second passivation layer 340 may be formed of an inorganic insulating material and has an unevenness structure of a cross-section of an angled profile. At this time, the first passivation layer 339 may be omitted. The second passivation layer 340 may be removed to correspond to a transmissive area TA and has a transmissive hole Th.

An auxiliary unevenness layer 350 may be formed on the second passivation layer 340 having the embossed structure. The auxiliary unevenness layer 350 may be formed of a material including germanium, for example, germanium (Ge), germanium silicon (GeSi) or germanium carbide (GeC). The auxiliary unevenness layer 350 may be a roughness structure including minute concave and convex portions at its surface.

A reflector 355 may be formed on the auxiliary unevenness layer 350. The reflector 355 may be an embossed structure due to the second passivation layer 340 and a roughness structure due to the auxiliary unevenness layer 350. The reflector 355 and the auxiliary unevenness layer 350 may be disposed in the reflective area RA. The reflector 355 and the auxiliary unevenness layer 350 may have an opening op1 corresponding to the drain electrode 336 of the thin film transistor Tr.

A third passivation layer 360 may be formed on the reflector 355. The third passivation layer 360 may have a drain contact hole 363 passing through the opening op1 and exposing the drain electrode 336 with the first and second passivation layers 330 and 340.

A pixel electrode 370 may be formed on the third passivation layer 360 and be connected to the drain electrode 336 through the drain contact hole 363. The pixel electrode 370 may correspond to the pixel region P including the reflective area RA and the transmissive area TA.

For similar reason set forth above with respect to the first and second embodiments, the reflection efficiency of the transflective type LCD device according to the third embodiment of the disclosure is improved in the reflective area RA.

A method of fabricating a reflective type LCD device of the disclosure will be explained with the accompanying drawings.

FIGS. 7A to 7F are cross-sectional views of an array substrate for the LCD device in steps of a method of fabricating the same according to the first exemplary embodiment of the disclosure.

Figure 7A:
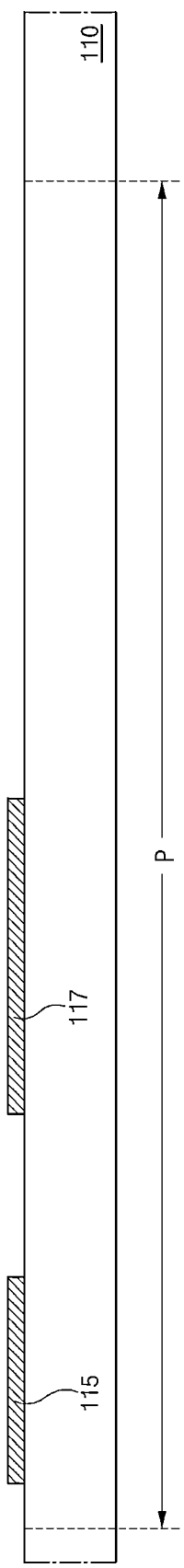

In FIG. 7A, a gate line (not shown), a common line 117 and a gate electrode 115 may be formed on a transparent insulating substrate 110 by patterning a first metallic layer (not shown) through a first mask process. The first mask process may include steps of forming the first metallic layer on a substantially entire surface of the substrate 110 by a depositing a first metallic material, applying photoresist to the first metallic layer, exposing the photoresist to light through a mask including a light-transmitting portion and a light-blocking portion, developing the light-exposed photoresist, and etching the first metallic layer using the developed photoresist as an etching mask. The common line 117 may be parallel to the gate line. The gate electrode 115 may be disposed in the pixel region P and is connected to the gate line.

Figure 7B:
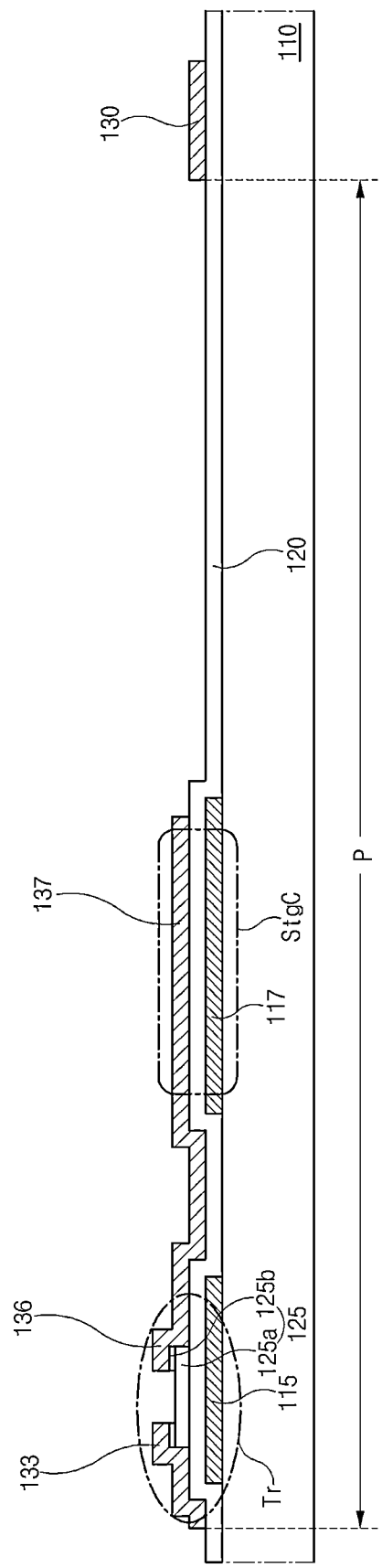

In FIG. 7B, a gate insulating layer 120 may be formed on a substantially entire surface of the substrate 110 including the gate line, the common line 117, and the gate electrode 115 by depositing an inorganic insulating material, for example, silicon oxide ($SiO_2$) or silicon nitride (SiNx). Subsequently, an intrinsic amorphous silicon layer (not shown) and an impurity-doped amorphous silicon layer (not shown) may be formed on the gate insulating layer 120 by depositing intrinsic amorphous silicon and impurity-doped amorphous silicon. The intrinsic amorphous silicon layer and an impurity-doped amorphous silicon layer may be patterned through a second mask process to thereby form an active layer 125a and an impurity-doped amorphous silicon pattern (not shown).

A data line 130 and source and drain electrodes 133 and 136 may be formed on the gate insulating layer 120 and the impurity-doped amorphous silicon pattern, respectively, by patterning a second metallic layer (not shown) through a third mask process. The third mask process may include steps of forming the second metallic layer on a substantially entire surface of the substrate 110 including the impurity-doped amorphous silicon pattern, applying photoresist to the second metallic layer, exposing the photoresist to light through a mask, developing the light-exposed photoresist, and etching the second metallic layer using the developed photoresist as an etching mask. The data line 130 may cross the gate line (not shown) to define a pixel region P, and the source and drain electrodes 133 and 136 may be spaced apart from each other over the impurity-doped amorphous silicon pattern. Although not shown in the figure, the source electrode 133 may be connected to the data line 130. A portion of the drain electrode 136 may overlap the common line 117, and the overlapping common line 117 and drain electrode 137 function as first and second storage electrodes, respectively. The first and second storage electrodes 117 and 137 may form a storage capacitor StgC with the gate insulating layer 120 therebetween. Then, the impurity-doped amorphous silicon pattern may be selectively removed to thereby form ohmic contact layers 125b.

Meanwhile, even though the active layer 125a, the ohmic contact layers 125b, the data line 130, and the source and drain electrodes 133 and 136 may be formed through two mask process including one mask process for patterning the amorphous silicon layer and the impurity-doped amorphous silicon layer and the other mask process for patterning the second metallic layer here, the active layer 125a, the ohmic contact layers 125b, the data line 130, and the source and drain electrodes 133 and 136 may be formed through a single mask process using a halftone light-exposure method or a diffraction light-exposure method. That is, the active layer 125a, the ohmic contact layers 125b, the data line 130, and the source and drain electrodes 133 and 136 may be formed by sequentially depositing the intrinsic amorphous silicon layer, the impurity-doped amorphous silicon layer and the second metallic layer and then patterning them through the single mask process using a mask, which includes a light-blocking portion, a light-transmitting portion and a half light-transmitting portion. In this case, first and second dummy patterns may be formed under the data line 130, and the first and second dummy patterns may be formed of the same materials as the active layer 125a and the ohmic contact layers 125b, respectively.

The gate electrode 115, the insulating layer 120, the active layer 125a, the ohmic contact layers 125b, and the source and drain electrodes 133 and 136, which are sequentially layered in the pixel region P, may form a thin film transistor Tr.

Figure 7C:
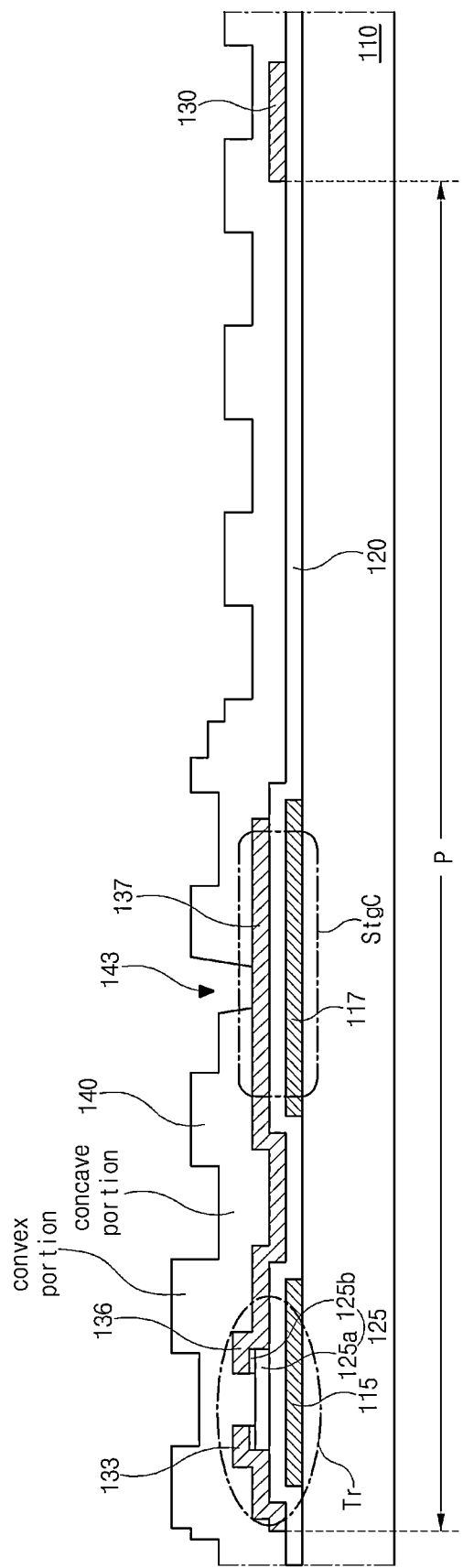

In FIG. 7C, a passivation layer 140 may be formed on a substantially entire surface of the substrate 110 including the data line 130, the thin film transistor Tr and the storage capacitor StgC by depositing an inorganic insulating material. The passivation layer 140 may have a thickness of 1 μm to 2 μm.

Next, photoresist patterns (not shown) may be formed on the first passivation layer 140. The photoresist patterns may be irregularly spaced apart from each other and have different widths. The passivation layer 140 may be selectively dry-etched using the photoresist patterns as an etching mask to thereby form concave portions and convex portions at a surface of the passivation layer 140 and remove the photoresist patterns. The convex portions may correspond to the photoresist patterns.

Meantime, referring to FIG. 4, in the second embodiment, the second passivation layer 240 may be formed by forming an organic insulating material layer on the data line 230, the thin film transistor Tr and the storage capacitor StgC by applying an organic insulating material, exposing the organic insulating material layer to light through a mask including light-transmitting portions and light-blocking portions irregularly arranged, and developing the light-exposed organic insulating material layer. At this time, the second passivation layer 240 may have the passivation layer 140 of FIG. 7C and may have a cross-section of an angled profile. The second passivation layer 240 may be heat-treated and reflowed to have the embossed structure. As stated above, the first passivation layer 239 of an inorganic insulating material may be formed between the thin film transistor Tr and the second passivation layer 240 of the organic insulating material.

Then, the passivation layer 140 may be patterned to thereby form a drain contact hole 143 exposing the drain electrode 136.

Figure 7D:
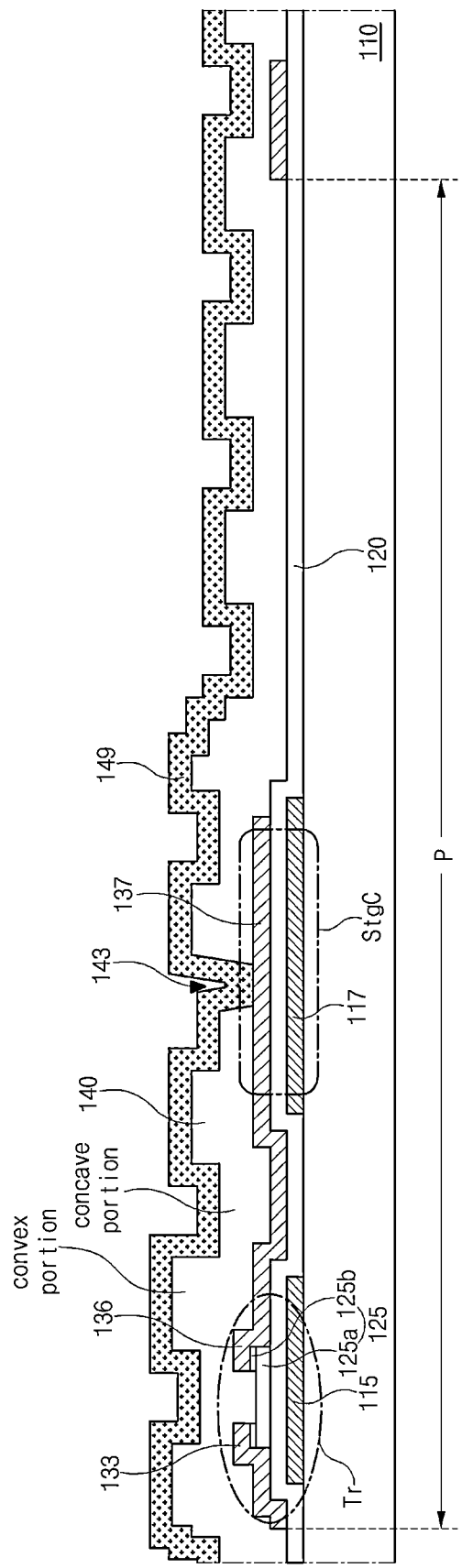

In FIG. 7D, an auxiliary unevenness material layer 149 may be formed on the passivation layer 140 having the unevenness structure by depositing a material including germanium, for example, germanium (Ge), germanium silicon (GeSi) or germanium carbide (GeC)

In FIG. 7E, the substrate 110 including the auxiliary unevenness material layer 149 of FIG. 7D thereon may be exposed to an etchant including hydrogen peroxide ($H_2O_2$), which reacts with germanium. Here, a particle of a molecule including germanium in the auxiliary unevenness material layer 149 of FIG. 7D is arranged such that its long axis is parallel to a normal direction of the auxiliary unevenness material layer 149 of FIG. 7D. Therefore, the auxiliary unevenness material layer 149 of FIG. 7D may be relatively fast etched in portions between the particles and is relatively slow etched in portions corresponding to the particles including germanium (Ge), carbon (C) or silicon (Si) to thereby form a roughness structure including minute concave and convex portions, which may correspond to the sizes of the particles, at its surface. The auxiliary unevenness material layer 149 of FIG. 7D may be exposed to the etchant for several seconds to several ten seconds.

Next, the auxiliary unevenness material layer 149 of FIG. 7D having the roughness structure may be patterned to thereby form an auxiliary unevenness layer 150 separately in each pixel region P. In addition, a drain contact hole 152 exposing the drain electrode 136 may be formed. Here, the drain contact hole 143 may be formed when the passivation layer 140 of FIG. 7C is patterned, and then the drain contact hole 152 may be formed again when the auxiliary unevenness material layer 149 of FIG. 7D is patterned. However, a step of forming the drain contact hole 143 of FIG. 7C may be omitted, and the drain contact hole may be formed by removing the auxiliary unevenness material layer 149 of FIG. 7D and the passivation layer 140 together using a halftone light-exposure method or a diffraction light-exposure method when the auxiliary unevenness material layer 149 of FIG. 7D is patterned.

Figure 7F:
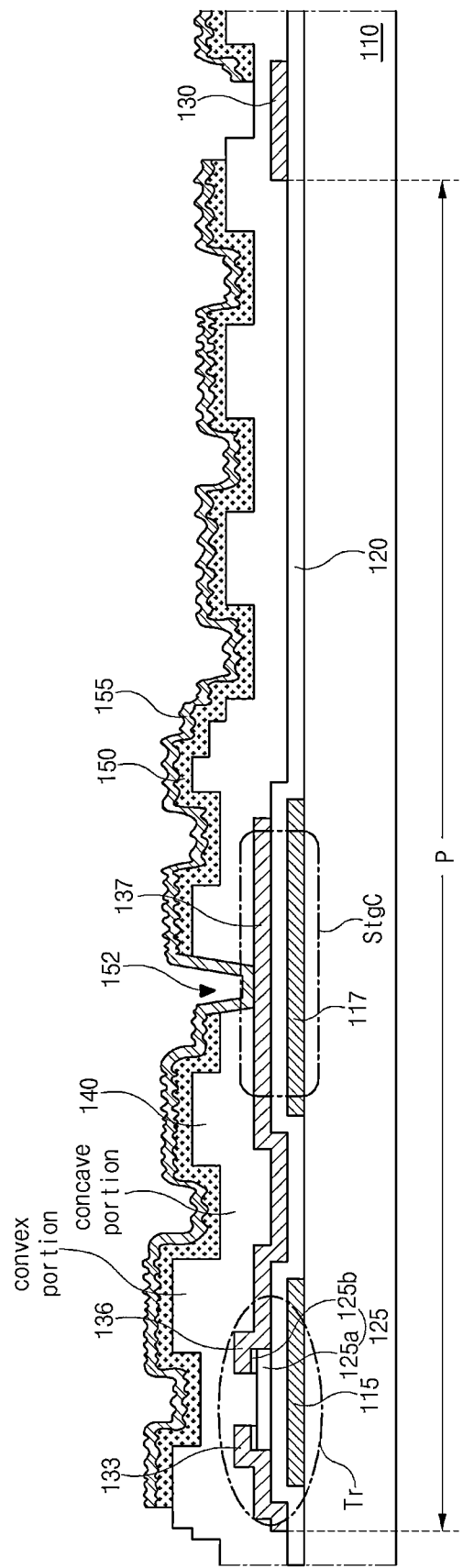

In FIG. 7F, a reflective metallic layer (not shown) may be formed on the auxiliary unevenness layer 150 by depositing a metallic material having relatively high reflectance, for example, one of aluminum (Al), aluminum neodymium (AlNd), silver (Ag), magnesium oxide (MgO) and titanium oxide (TiOx). Then, the reflective metallic layer may be patterned to thereby form a reflector 155. The reflector 155 is connected to the drain electrode 136 through a drain contact hole 152 and functions as a reflective electrode.

Accordingly, the array substrate for the reflective type LCD device according to the first embodiment of the disclosure is completed.

Meanwhile, referring to FIG. 6, in the reflective type LCD device according to the third embodiment of the disclosure, when the first passivation layer 340 is formed, the drain electrode exposing the drain electrode 336 may not be formed, and the transmissive hole Th may be formed by removing the first passivation layer 340 corresponding to the transmissive area TA. In addition, when the auxiliary unevenness layer 350 and the reflector 355 are formed, the opening op1 may be formed to correspond to the drain electrode 336, and the auxiliary unevenness layer 350 and the reflector 355 may be removed to correspond to the transmissive hole Th.

Then, the third passivation layer 360 may be formed of an inorganic insulating material or an organic insulating material on the reflector 355, and the third passivation layer 360 may be patterned with the first and second passivation layers 339 and 340 to thereby form the drain contact hole 363 exposing the drain electrode 336.

Next, a transparent conductive material layer (not shown) may be formed on the third passivation layer 360 by depositing a transparent conductive material and may be patterned to thereby form the pixel electrode 370, which is connected to the drain electrode 336 through the drain contact hole 363. Therefore, the array substrate for the transflective type LCD device according to the third embodiment of the disclosure is completed.

In the disclosure, the reflective type LCD device or the transflective type LCD device includes the reflector having a roughness structure, which includes minute concave and convex portions, at its surface, the reflectance of the reflector is increased.

It will be apparent to those skilled in the art that modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An array substrate for a liquid crystal display device, comprising:
   a substrate;
   a gate line and a data line on the substrate and crossing each other to define a pixel region;
   a thin film transistor connected to the gate line and the data line;
   a first passivation layer on the thin film transistor and having a first unevenness structure at its top surface;
   an auxiliary unevenness layer on the first passivation layer and having a first roughness structure at its top surface; and
   a reflector on the auxiliary unevenness layer, the reflector having a second unevenness structure due to the first unevenness structure of the first passivation layer and a second roughness structure due to the first roughness structure of the auxiliary unevenness layer, the second roughness structure having smaller patterns than the second unevenness structure,
   wherein the first passivation layer and the auxiliary unevenness layer have a contact hole exposing an electrode of the thin film transistor, and the reflector is directly connected to the electrode through the contact hole.

2. The array substrate according to claim 1, wherein the first passivation layer is formed of an inorganic insulating material and has a cross-section of an angled profile or is formed of an organic insulating material and has a cross-section of a curved profile.

3. The array substrate according to claim 1, wherein the auxiliary unevenness layer is formed of a material including germanium and is treated by an etchant including hydrogen peroxide ($H_2O_2$).

4. The array substrate according to claim 3, wherein the material including germanium is one of germanium (Ge), germanium silicon (GeSi) and germanium carbide (GeC).

5. The array substrate according to claim 1, wherein the first passivation layer and the auxiliary unevenness layer have a drain contact hole exposing a drain electrode of the thin film transistor, and the reflector is connected to the drain electrode through the drain contact hole.

6. An array substrate for a liquid crystal display device, comprising:
   a substrate;
   a gate line and a data line on the substrate and crossing each other to define a pixel region;
   a thin film transistor connected to the gate line and the data line;
   a first passivation layer on the thin film transistor and having a first unevenness structure at its top surface;
   an auxiliary unevenness layer on the first passivation layer and having a first roughness structure at its top surface; and
   a reflector on the auxiliary unevenness layer, the reflector having a second unevenness structure due to the first unevenness structure of the first passivation layer and a second roughness structure due to the first roughness structure of the auxiliary unevenness layer, the second roughness structure having smaller patterns than the second unevenness structure,
   wherein the pixel region includes a reflective area and a transmissive area, the reflector and the auxiliary unevenness layer are disposed in the reflective area, a second passivation layer is formed on the reflector, and a pixel electrode is formed on the second passivation layer, wherein the pixel electrode corresponds to the reflective area and the transmissive area,
   wherein the second passivation layer and the first passivation layer have a drain contact hole exposing a drain electrode of the thin film transistor, and the pixel electrode is directly connected to the drain electrode through the drain contact hole.

7. The array substrate according to claim 6, wherein the reflector and the auxiliary unevenness layer have an opening corresponding to the drain electrode, and the drain contact hole is disposed in the opening.

8. The array substrate according to claim 7, wherein the first passivation layer has a transmissive hole corresponding to the transmissive area.

9. The array substrate according to claim 1, further comprising a common line on the substrate and parallel to the gate line, wherein a drain electrode of the thin film transistor overlaps the common line to form a storage capacitor.

* * * * *